Aug. 7, 1951 C. F. EDWARDS 2,563,591

MICROWAVE CONVERTER

Filed Jan. 24, 1946 2 Sheets-Sheet 1

INVENTOR
C. F. EDWARDS
BY
Ralph T. Holcomb
ATTORNEY

Aug. 7, 1951 C. F. EDWARDS 2,563,591

MICROWAVE CONVERTER

Filed Jan. 24, 1946 2 Sheets-Sheet 2

INVENTOR
C. F. EDWARDS
BY
Ralph T. Holcomb
ATTORNEY

Patented Aug. 7, 1951

2,563,591

UNITED STATES PATENT OFFICE 2,563,591

MICROWAVE CONVERTER

Charles F. Edwards, Red Bank, N. J., assignor to Bell Telephone Laboratories, Incorporated, New York, N. Y., a corporation of New York Application January 24, 1946, Serial No. 643,093

3 Claims. (Cl. 250—20)

This invention relates to microwave converters and more particularly to those employing non-linear impedances.

The principal object of the invention is to stabilize the conversion loss in a wide band microwave converter.

The microwave converter in accordance with one embodiment of the present invention comprises input and output terminals, a non-linear impedance, a source of local oscillator waves, and appropriate connecting networks of novel design. Over a wide band the output is linearly proportional to the input but differs therefrom in frequency. These networks include an input filter, an input tuner, a low-pass filter, and an output filter with impedance and transmission characteristics designed to stabilize the conversion loss over a wide transmission band. Both the low-pass filter and the output filter comprise a section of coaxial transmission line and a disc transmission line connected in series. The disc line is preferably filled with dielectric material to reduce its diameter. The input tuner preferably comprises a pair of variable impedance branches connected across the input wave guide an eighth wavelength apart and each comprising an inductor and a capacitor in parallel. The low-pass filter freely passes the signal and local oscillator waves but blocks undesired harmonics thereof which may be generated in the non-linear impedance, which is preferably a point contact rectifier. The output filter freely passes the output frequency but prevents the escape of signal and local oscillator energy.

The nature and objects of the invention, together with its principal and subsidiary features, will be more fully understood from the following detailed description and by reference to the accompanying drawing, in which like reference characters refer to similar or corresponding parts and in which.

Figure 1:
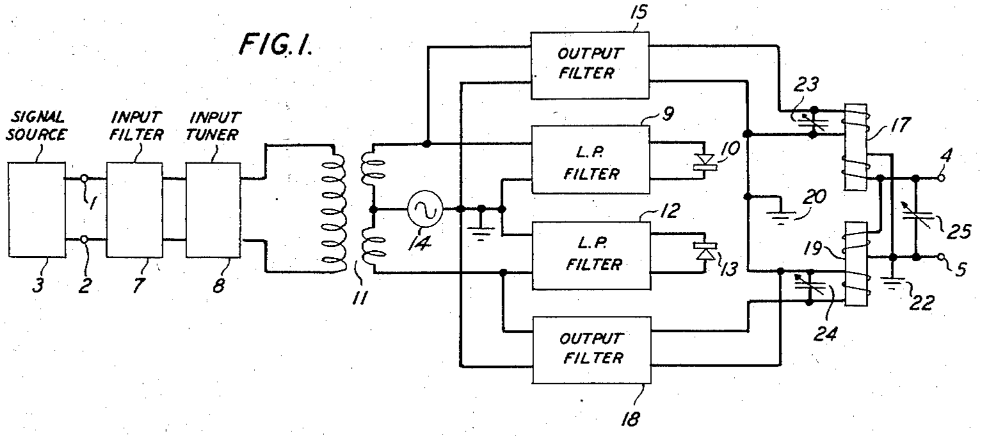
Fig. 1 is a schematic circuit, partly in block, of a microwave converter in accordance with the invention.

As shown in the schematic circuit of Fig. 1, the microwave converter in accordance with the invention is a balanced structure having a pair of input terminals 1, 2 to which a source 3 of high frequency signal waves is connected and a pair of output terminals 4, 5 to which a utilization circuit may be connected. The signal waves, after passing through an input filter 7 and an input tuner 8, are impressed upon a hybrid T wave guide junction, shown schematically as a three-winding transformer 11, wherein the energy divides into two equal portions. One portion passes through a low-pass filter 9 to a non-linear impedance element 10 and the other through a similar filter 12 to a second similar element 13. A source of local oscillator waves 14 is connected to the common terminal of the two equal output windings of the transformer 11.

Half of the output energy is taken off at the input to the filter 9 and the other half at the input to the filter 12. One portion passes through the output filter 15 and is impressed upon the primary winding of one of the balanced to unbalanced output transformers 17 and the other portion passes through a second output filter 18 and is impressed upon the primary winding of the other output transformer 19. One side of each of these primary windings is grounded as indicated at 20. The secondary windings are connected in parallel to the output terminals 4, 5, one of which is grounded as shown at 22. The input windings of the transformers 17 and 19 are tuned to the desired frequency by means of the variable shunt capacitors 23 and 24, respectively, and the output windings by the shunt capacitor 25.

The purpose of the input filter 7 is to select the desired signal waves. The tuner 8 improves the impedance match between the converter and the signal source 3. The low-pass filters 9 and 12 freely transmit the signal and local oscillator waves, but block harmonics thereof which may be produced in the rectifiers 10 and 13. The output filters 15 and 18 pass the output frequency but present substantially an infinite shunt impedance so far as the signal and local oscillator waves are concerned, thus substantially preventing the loss of input power in the output circuit. These networks, when located as shown and properly designed, contribute materially to the stabilization of the conversion loss of the converter over a wide range of frequencies.

Figure 2:
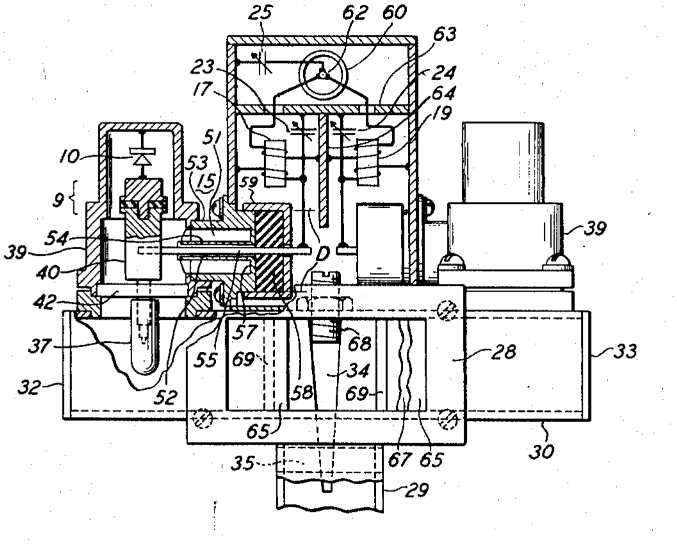
Fig. 2 is a side view, partly in section, of the converter.
Figure 4:
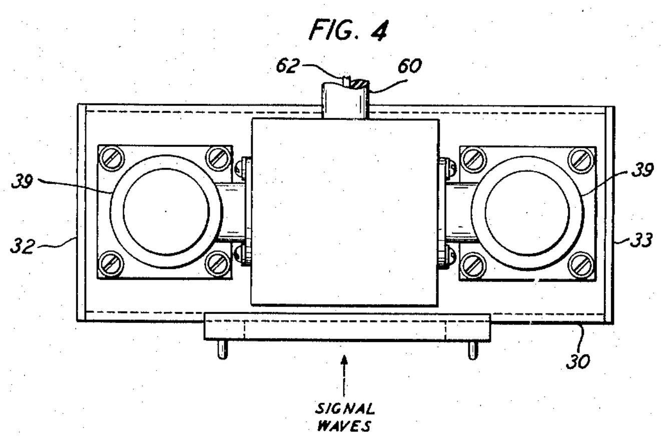
Fig. 4 is a top view of the converter without the input filter and input tuner.
Figure 3:
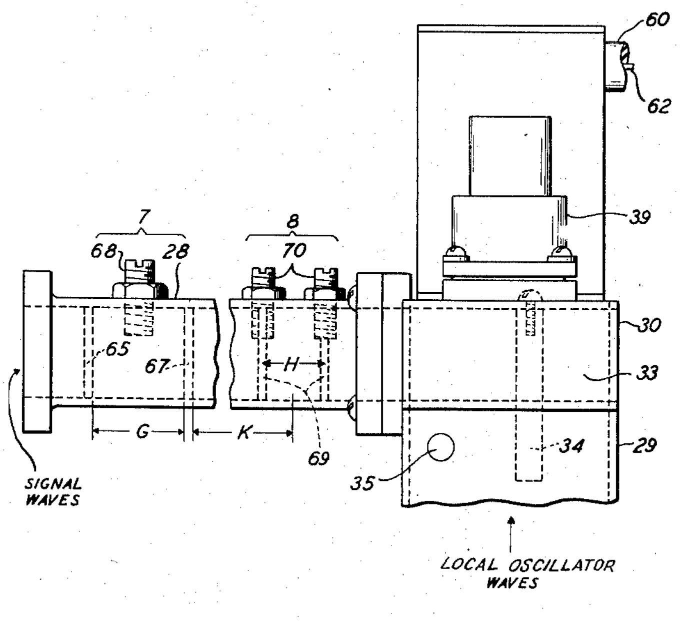
Fig. 3 is an end view.

A preferred embodiment of the converter is shown in Figs. 2, 3 and 4. The signal waves are introduced through a wave guide 28 and the local oscillator waves through a wave guide 29. These waves are combined in a hybrid T wave guide junction which comprises a section of wave guide 30 closed at its ends by the plates 32 and 33. All of the guides 28, 29 and 30 have the same rectangular cross-section, with one cross-sectional dimension approximately twice that of the other. The guides 28 and 29 join the guide 30 at the center of the latter and the longitudinal axes of the three guides are mutually perpendicular. The guide 28 joints the narrower side of the guide 30 and their shorter cross-sectional dimensions are parallel. The guide 29 joins the wider side of the guide 30 and their longer cross-sectional dimensions are parallel.

In order to improve the impedance match the junction includes a tapered metal rod 34 mounted on one of the wider sides of the guide 30 so that its smaller end extends into the end of the guide 29 and a cylindrical metal rod 35 extending between the wider sides near the end of the guide 29. The hybrid T wave guide junction with rods for impedance matching is described in more detail in my copending application Serial No. 637,124, filed December 24, 1945.

The converter is of balanced construction. The signal energy and the local oscillator energy divide at the junction into two equal portions, one of which travels toward one end of the guide 30 and the other toward the other end. Each portion is picked up by a probe 37 which projects through an opening in one of the wider sides near the end of the guide 30. The probe 37 is connected to a non-linear impedance element 10, shown schematically in Fig. 2, by a section of coaxial transmission line 39 the inner conductor 40 of which is supported by an insulating disc 42. The element 10 is preferably a point contact rectifier and may, for example, comprise a silicon wafer and a fine wire one end of which rests upon the surface of the wafer. A suitable point contact rectifier is disclosed in the copending application of W. M. Sharpless, Serial No. 483,607, filed April 19, 1943, now Patent No. 2,436,830 issued March 2, 1948.

In order to stabilize the conversion loss over a wide frequency range a low-pass filter 9 is included in the coaxial line 39 near the rectifier 10. This filter is designed to transmit freely the operating range but to attenuate strongly all second harmonics of this range which may be generated in the rectifier 10.

Figure 5:
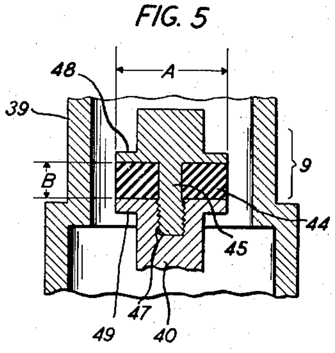
Fig. 5 is a cross-sectional view, to a larger scale, of the low-pass filter.

As shown in Fig. 2, and to a larger scale in Fig. 5, the filter 9 comprises a disc transmission line 44 connected in series with the coaxial line 39 and associated physically with the inner conductor 40. A disc transmission line consists essentially of a radially extending annular groove or chamber either in the inner conductor or on the inside of the outer conductor of a coaxial transmission line. The disc line 44 is formed by making the inner conductor in two parts, one of which has an end portion 45 of reduced diameter threaded for insertion into a tapped hole 47 in the end of the other part. The diameter A is so chosen that the line 44 is antiresonant at some frequency within the range of the second harmonics of the signal and local oscillator waves so that these harmonics, which may be generated in the rectifier 10, will not pass the filter 9.

The disc line 44 is preferably filled with solid dielectric material, as shown, in order to decrease the required diameter A. Polystyrene is a suitable material for this purpose. If the diameter A is still larger than the diameter of the inner conductor 40, a pair of flanges 48 and 49 may be provided. These flanges 48 and 49 introduce two shunt capacitances which appear effectively at the ends of the series antiresonant impedance. The resulting filter schematic will be of the type shown in Fig. 10 of Patent 1,493,600, issued May 13, 1924, to G. A. Campbell, to which reference is made for design formulas.

The image impedance of the filter 9 depends upon the characteristic impedance of the disc line 44 which, in turn, is dependent upon its thickness B. The dimension B is, therefore, preferably so chosen that the filter 9 matches the coaxial line 39 in impedance over the operating frequency range.

The output circuit branches off from the coaxial line 39 and, in order to prevent loss of the high frequency energy, includes an output filter 15 which will freely pass the output energy but block the signal and local oscillator energy. As shown in Fig. 2, the filter 15 comprises two concentrically arranged sections of coaxial transmission line 51 and 52 connected at one end in series across the coaxial line 39. The outer conductor 53 of the outer section 51 is connected to the outer conductor of the line 39. The inner conductor 54 of the section 51 is hollow and also serves as the outer conductor of the inner section 52. The inner conductor 55 of the inner section 52 is connected to the inner conductor 40 of the line 39. Each of the sections 51 and 52 has a length approximately equal to $$\frac{\lambda}{4}$$

where $\lambda$ is the wavelength corresponding to the mid-band frequency $f$ of the signal frequency range of the converter. The outer section 51 is closed at its outer end 57 and, therefore, presents a high impedance at its inner end at the frequency $f$.

A disc transmission line 58 is connected in series at the outer end of the inner section 52 and physically associated with the outer conductor 54 of the section 52. The disc line 58 is closed at its circumference by a metal cylinder 59 and the diameter D is so chosen that the line 58 presents a high impedance at the frequency $f$. In order to reduce the diameter D the disc line 58 is filled with solid dielectric material such, for example, as polystyrene. Since the inner section 52 is thus in effect open-circuited at its outer end, it presents a low impedance at its inner end at the frequency $f$, and the inner conductor 54 of the outer section 51 is, in effect, directly connected to the inner conductor 40. The inner section 52 will, however, freely transmit the output energy.

The output from the filter 15 is impressed upon the primary winding of the transformer 17 and the output from the filter 18 is impressed upon the primary winding of the transformer 19. These primary windings are tuned by means of the variable capacitors 23 and 24, respectively. The secondary windings of these transformers are connected in parallel and tuned by means of the variable capacitor 25. The output transmission line is of the coaxial type, comprising an outer conductor 60 and an inner conductor 62. The ouput line is shielded from the transformers 17 and 19 by a metal partition 63, and the transformers are shielded from each other by the partition 64.

The input filter 7 and input tuner 8 are shown in Figs. 2 and 3 but have been omitted in Fig. 4. The input filter 7 comprises two irises 65 and 67 across the input wave guide 28 spaced at a distance G approximately equal to $$\frac{\lambda}{4}$$

Each of the irises 65 and 67 is constituted by two partial partitions extending between the wider sides of the guide 28. The filter 7 is tuned by means of a capacitance tuning plug 68.

The input tuner 8, provided to improve the impendance match between the signal source 3 and the converter, is located between the filter 7 and the remainder of the converter. The tuner 8 comprises two variable impedance branches connected across the guide 28 and spaced apart a distance H approximately equal to $$\frac{\lambda}{8}$$

Each of the branches comprises an inductive rod 69 extending between the wider sides of the guide 28 and a capacitance tuning plug 70 positioned beside the rod 69. The tuning plugs 70 are centrally located in one of the wider sides of the guide 28. However, one of the rods 69 is placed to one side of the longitudinal axis of the guide 28 and the other rod 69 to the other side thereof as shown in Fig. 2. The center of the tuner 8 is spaced from the iris 67 a distance K approximately equal to $$\frac{\lambda}{2}$$

in order to minimize the phase change in the waves reflected from the inner end of the filter 7 resulting from adjusting the tuner. The inductance of the rod 69 depends upon its diameter and its distance from the narrower side of the guide 28. By properly choosing the value of this inductance the tuner may be designed to correct a small impedance mismatch at any phase angle.

What is claimed is:

1. A wave filter for suppressing a selected frequency comprising an inner conductor, a tubular outer conductor, a tubular intermediate conductor, and conductive walls forming an annular chamber having an opening at the inner periphery thereof, said three conductors being concentrically arranged, said outer and intermediate conductors being short-circuited at one end and each having a length approximately equal to a quarter wavelength at said frequency, and said chamber surrounding said inner conductor at said one end of said intermediate conductor and having an outer diameter so chosen that said chamber is anti-resonant at said frequency.

2. A filter in accordance with claim 1 in which said chamber is substantially filled with solid dielectric material.

3. A microwave converter comprising a non-linear impedance element, a source of signal waves, a source of local oscillator waves, means comprising a common coaxial transmission line for impressing said waves upon said element, low-pass wave filter in said transmission line, and an output filter connected to said transmission line, said low-pass filter comprising an inner conductor and a current-carrying tubular outer conductor concentric therewith, said inner conductor having an annular groove formed therein and said groove being filled with solid dielectric material and having a depth so chosen that said groove is antiresonant at the second harmonic of said signal waves, and said output filter comprising a section of coaxial transmission line, conductive walls forming a first chamber, and conductive walls forming a second chamber, each of said chambers being antiresonant at approximately the frequency of said signal waves and said chambers being connected to said last-mentioned section of coaxial transmission line at points which are spaced apart approximately a quarter of a wavelength at the frequency of said signal waves.

CHARLES F. EDWARDS.

REFERENCES CITED

The following references are of record in the file of this patent:

UNITED STATES PATENTS

| Number | Name | Date |
|---|---|---|
| 1,304,868 | Franklin | May 27, 1919 |
| 1,912,794 | Peterson | June 6, 1933 |
| 2,030,180 | Potter | Feb. 11, 1936 |
| 2,064,585 | Atienza | Dec. 15, 1936 |
| 2,149,356 | Mason | Mar. 7, 1939 |
| 2,274,346 | Roosenstein | Feb. 24, 1942 |
| 2,332,952 | Tischer | Oct. 26, 1943 |
| 2,408,420 | Gintzon | Oct. 1, 1946 |
| 2,432,093 | Fox | Dec. 9, 1947 |
| 2,433,387 | Mumford | Dec. 30, 1947 |
| 2,436,830 | Sharpless | Mar. 2, 1948 |
| 2,437,482 | Salisbury | Mar. 9, 1948 |
| 2,438,913 | Hansen | Apr. 6, 1948 |